United States Patent
Eliason et al.

(10) Patent No.: US 6,430,093 B1
(45) Date of Patent: Aug. 6, 2002

(54) CMOS BOOSTING CIRCUIT UTILIZING FERROELECTRIC CAPACITORS

(75) Inventors: Jarrod Eliason, Colorado Springs; William F. Kraus, Palmer Lake, both of CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/864,858

(22) Filed: May 24, 2001

(51) Int. Cl.⁷ .................................................. G11C 7/00
(52) U.S. Cl. ............. 365/189.11; 365/145; 365/230.06; 326/88
(58) Field of Search ...................... 365/65, 145, 185.23, 365/189.11, 230.06, 226; 326/88, 92

(56) References Cited

U.S. PATENT DOCUMENTS

| | | | |
|---|---|---|---|
| 4,063,117 A | * 12/1977 | Laugesen et al. | 326/88 |
| 5,373,463 A | 12/1994 | Jones, Jr. | 365/145 |
| 5,455,786 A | 10/1995 | Takeuchi et al. | 365/145 |
| 5,487,029 A | 1/1996 | Kuroda | 365/145 |
| 5,532,953 A | 7/1996 | Ruesch et al. | 365/145 |
| 5,539,279 A | 7/1996 | Takeuchi et al. | 365/145 |
| 5,550,770 A | 8/1996 | Kuroda | 365/145 |
| 5,579,257 A | 11/1996 | Tai | 365/145 |
| 5,598,366 A | 1/1997 | Kraus et al. | 365/145 |
| 5,708,373 A | * 1/1998 | Inoue | 326/88 |
| 5,724,283 A | 3/1998 | Tai | 365/145 |
| 5,774,392 A | 6/1998 | Kraus et al. | 365/145 |
| 5,910,911 A | 6/1999 | Sekiguchi et al. | 365/145 |
| 5,959,878 A | 9/1999 | Kamp | 365/117 |
| 5,999,461 A | 12/1999 | Verhaeghe et al. | 365/189.11 |
| 6,028,782 A | 2/2000 | Hirano et al. | 365/145 |
| 6,031,755 A | 2/2000 | Ozawa | 365/145 |
| 6,097,623 A | 8/2000 | Sakata et al. | 365/145 |
| 6,144,589 A | * 11/2000 | Micheloni et al. | 365/189.11 |
| 6,215,692 B1 | 4/2001 | Kang | 365/145 |
| 6,259,632 B1 | * 7/2001 | Khouri et al. | 365/185.23 |
| 6,275,425 B1 | * 8/2001 | Eliason | 365/189.11 |
| 6,335,900 B1 | * 1/2002 | Kwon et al. | 365/230.06 |

* cited by examiner

Primary Examiner—Tan T. Nguyen
(74) Attorney, Agent, or Firm—William J. Kubida, Esq.; Peter J. Meza, Esq.; Hogan & Hartson, LLP

(57) ABSTRACT

A boosting circuit for a ferroelectric memory using a NAND-INVERT circuit to control one electrode of a ferroelectric boosting capacitor. The other node of the capacitor is connected to the node to be boosted, which may be coupled to a word line. The NAND circuit has two inputs, one being coupled to the word line and another for receiving a timing signal. The timing input rises to initiate the boosting operation, and falls to initiate the removal of the boosted voltage. Only the selected word line in the memory array is affected as any word line remaining at a low logic level "0" will keep the inverter output clamped low. A second embodiment adds a second N-channel transistor in series with the inverter's N-channel transistor to allow for the option of floating the inverter output if it is desired to more quickly drive the word line high during its first upward transition.

20 Claims, 5 Drawing Sheets

CMOS BOOSTING CIRCUIT UTILIZING FERROELECTRIC CAPACITORS

BACKGROUND OF THE INVENTION

Desirable power supply voltages are becoming lower and lower, tending towards three volts and even lower in some recent applications. The challenge that faces designers of ferroelectric memories is to design solutions that allow the memory cell transistors to operate in the saturation region even at these very low voltages. While advances have been made in ferroelectric thin film technology to enable these ferroelectric materials to operate at low power supply voltages, corresponding advances in ferroelectric memory circuit designs are required as well.

A typical two transistor, two capacitor ("2T/2C") ferroelectric memory cell 10 is shown in FIG. 1. Ferroelectric memory cell 10 includes two ferroelectric capacitors Z1 and Z2 and two N-channel transistors M1 and M2. A word line 12 is coupled to the gates of transistors M1 and M2, and plate line 14 is coupled to the bottom electrode of ferroelectric capacitors Z1 and Z2. The top electrodes of ferroelectric capacitor Z1 and Z2 are coupled to the source/drains of each of transistors M1 and M2. Two complementary bit lines 16 and 18 are coupled to the other source/drains of each of transistors M1 and M2. Non-volatile data is stored as a complementary polarization vector in ferroelectric capacitors Z1 and Z2. A typical one transistor, one capacitor ("1T/1C") ferroelectric memory cell 20 is shown in FIG. 2. Ferroelectric memory cell 20 includes a ferroelectric capacitor Z3 and an N-channel transistor M3. A word line 22 is coupled to the gate of transistor M3, and a plate line 24 is coupled to the bottom electrode of ferroelectric capacitor Z3. The top electrode of ferroelectric capacitor Z3 is coupled to the source/drain of transistor M3. A bit line 26 is coupled to the other source/drains of transistors M3. Non-volatile data is stored as a polarization vector in ferroelectric capacitors Z3.

To ensure the proper operation of ferroelectric random access memory ("FRAM") technology at low power supply voltages, in either a 1T/1C or 2T/2C architecture, the most critical point for retaining data in the ferroelectric capacitors is to make sure that the data that is written to the cell is at the full supply potential. It is also desirable that the word line be boosted to compensate for the body-effected voltage (VTN) drop of transistors M1, M2, and M3, which is accomplished only if the word line is driven above the VDD power supply voltage by a voltage of at least VTN.

What is desired, therefore, is a ferroelectric boost circuit for use in either 1T/1C or 2T/2C ferroelectric memory architectures so that none of the limited power supply voltage is lost and the full power supply voltage is written to each ferroelectric memory cell.

SUMMARY OF THE INVENTION

According to the present invention, a NAND-INVERT circuit is used to control one electrode of a ferroelectric boosting capacitor. The other node of the capacitor is connected to the node to be boosted, which may be coupled to a word line. The NAND circuit has two inputs, one being coupled to the word line or other node to be boosted and another for receiving a timing signal. The timing input rises to initiate the boosting operation, and falls to initiate the removal of the boosted voltage. Only the selected word line in the memory array is affected as any word line remaining at a low logic level "0" will keep the inverter output clamped low. A second embodiment adds a second N-channel transistor in series with the inverter's N-channel transistor to allow for the option of floating the inverter output if it is desired to more quickly drive the word line high during its first upward transition.

It is an advantage of the boost circuit of the present invention that it provides a relatively simple circuit and approach for boosting the word line in a ferroelectric memory array without any loss of marginality at low operating voltage. It is a further advantage of the boost circuit of the present invention that it is compatible with any CMOS process, at any practical supply level. Boosting the word line insures that, when an NMOS access device is used, a full VDD restore voltage is realized for the "1" polarization state when writing a new state or restoring the previously read state. A full VDD restore improves data retention reliability.

It is a further advantage of the boost circuit of the present invention that the circuit is inherently easy to use in that only one timing signal is required.

It is a further advantage of the boost circuit of the present invention that the inverter output is guaranteed to go fully from ground or the negative power rail to the positive power rail, thus ensuring that the maximum possible voltage is available for boosting.

The foregoing and other objects, features and advantages of the invention will become more readily apparent from the following detailed description of a preferred embodiment of the invention, which proceeds with reference to the accompanying drawings.

DETAILED DESCRIPTION

Figure 1:
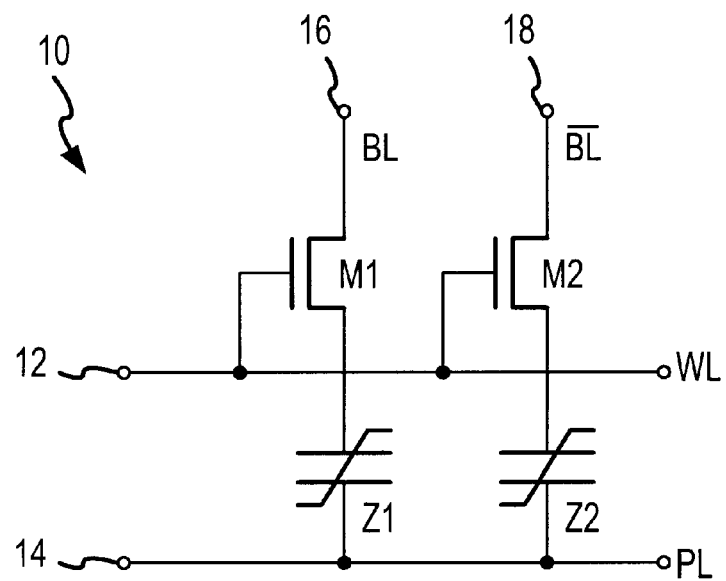
FIG. 1 is a schematic diagram of a prior art 2T/2C ferroelectric memory cell for use in a ferroelectric memory array.
Figure 2:
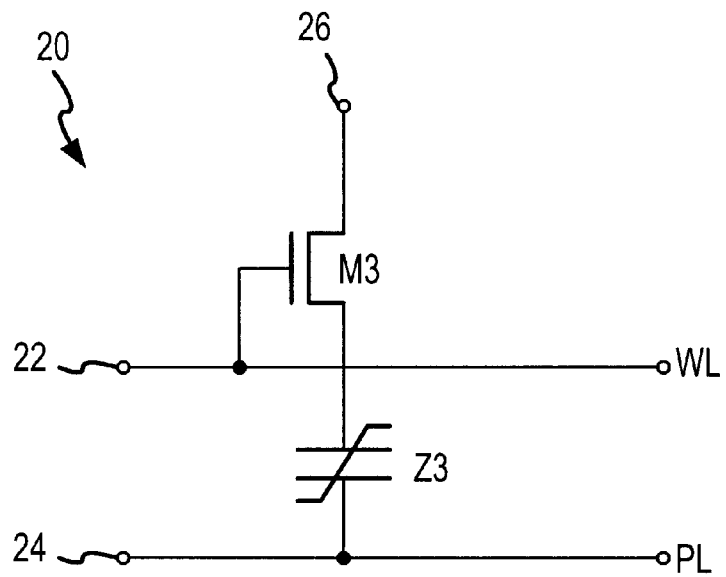
FIG. 2 is a schematic diagram of a prior art 1T/1C ferroelectric memory cell for use in a ferroelectric memory array.
Figure 3:
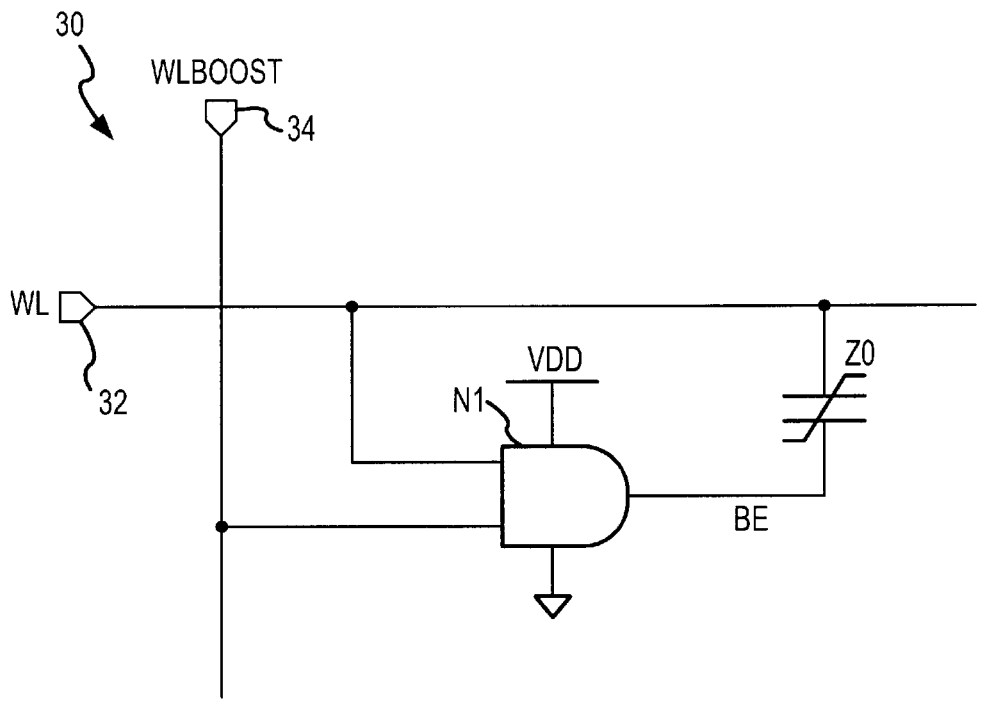
FIG. 3 is a schematic diagram of a first embodiment of a boost circuit according to the present invention.

Referring now to FIG. 3, a boost circuit 30 for boosting a word line 32 in a ferroelectric memory array (array not shown in FIG. 3) or any desired output node voltage includes an AND gate N1 having a first input coupled to the word line 32 or output node, a second input 34 for receiving a boost control signal, and an output. A capacitor circuit Z0 has a first node coupled to the output of the AND gate N1 and a second node coupled to the word line 32 or output node. The AND gate N1 further includes a first power terminal coupled to VDD and a second power terminal coupled to ground or VSS.

Figure 4:
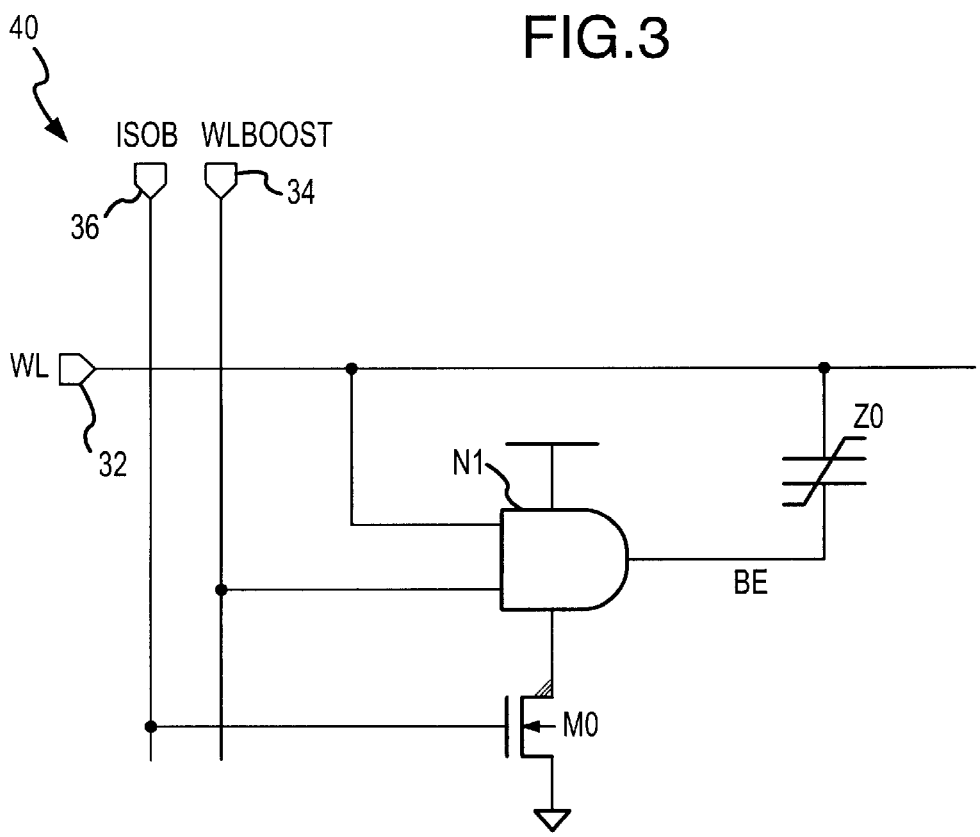
FIG. 4 is a schematic diagram of a second embodiment of a boost circuit according to the present invention including an additional N-channel isolation transistor not present in the circuit of the first embodiment shown in FIG. 3.

A second embodiment 40 of the boost circuit is shown in FIG. 4 in which the AND gate N1 includes a first power terminal coupled to VDD and a second power terminal coupled to N-channel transistor M0. The current path of transistor M0 is coupled between the second power terminal of AND gate N1 and ground. The gate of transistor M0 receives an ISOB control signal at node 36. The ISOB control signal is an active low logic signal, wherein a logic low turns off transistor M0 and isolates AND gate N1 from loading capacitor Z0.

Figure 6:
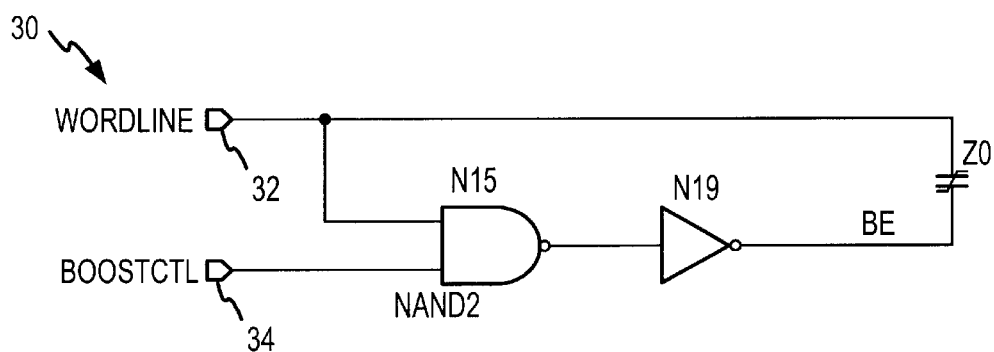
FIG. 6 is a more detailed schematic diagram wherein the AND gate of FIG. 3 is replaced by a serial combination of a NAND gate and an inverter.
Figure 8:
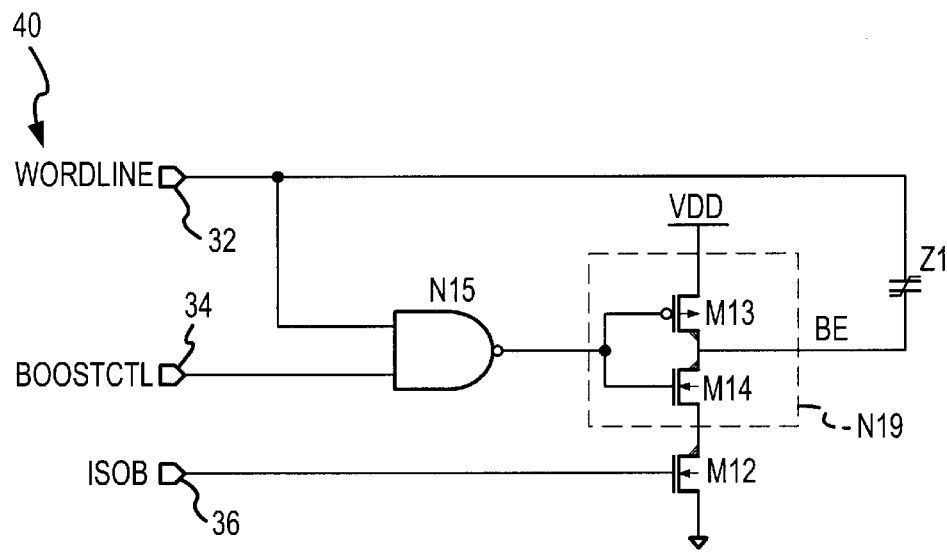
FIG. 8 is a more detailed schematic diagram wherein the AND gate of FIG. 4 is replaced by a serial combination of a NAND gate and an inverter, and also include N-channel transistor for isolation purposes.

As shown in FIGS. 6 and 8, the AND gate of boost circuits 30 and 40 can be replaced by a serial combination of a NAND gate and an inverter. In FIG. 6 boost circuit 30 includes NAND gate N15 coupled to inverter N19, and likewise in FIG. 8 boost circuit 40 includes NAND gate N15 coupled to inverter N19.

Figure 5:
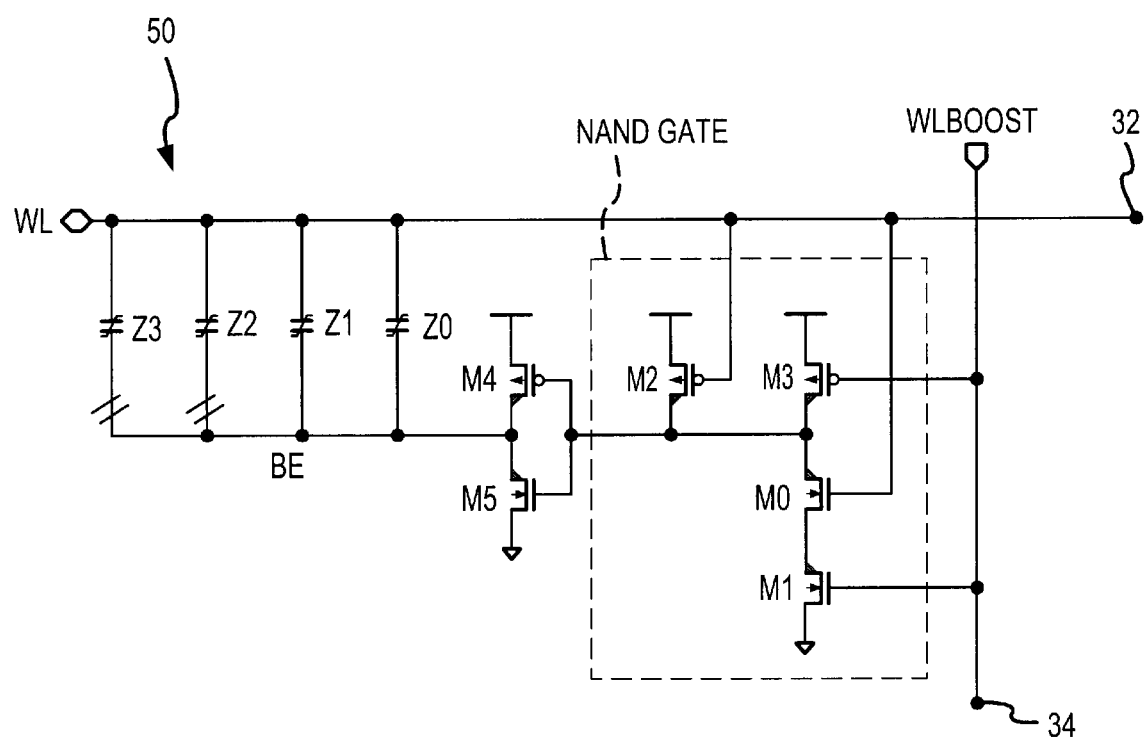
FIG. 5 is a more detailed transistor-level schematic diagram of the boost circuit shown in FIG. 3.

Referring now to FIG. 5, a boost circuit 50 corresponding to previously described boost circuit 30 is shown in a more detailed transistor-level schematic. Other transistor-level implementations of boost circuit 30 are possible. The NAND gate of boost circuit 50 includes transistors M1, M0, and M3 having serially coupled current paths. The gate of transistor M0 forms the first NAND gate input at node 32. The gates of transistors M1 and M3 are coupled together to form the second NAND gate input at node 34. The junction of the source/drains of transistors M0, M2 and M3 form the output of the NAND gate. Transistor M3 is a P-channel transistor, and transistors M0 and M1 are N-channel transistors. A source/drain of P-channel pull-up transistor M2 is coupled to the output of the NAND gate. The other source/drain is coupled to VDD and the gate is coupled to node 32.

In boost circuit 50 the inverter includes P-channel transistor M4 and N-channel transistor M5 having serially coupled current paths. The gates of transistors M4 and M5 are coupled together and form the input of the inverter. One of the source/drains of transistors M4 and M5 are coupled together to form the output of the inverter. The other source/drains are coupled to VDD and ground.

A capacitor circuit includes ferroelectric transistors Z0, Z1, Z2, and Z3 and is coupled between the output of the inverter and word line node 32. Ferroelectric capacitors Z0 and Z1 are shown "hard-wired" into boost circuit 50, whereas ferroelectric capacitors Z2 and Z3 are shown as being metalmask programmable. That is, ferroelectric capacitors Z2 and Z3 may be selectively electrically coupled to or isolated from the circuit based upon the amount of voltage boosting required at node 32. It is apparent to those skilled in the art that one or more ferroelectric capacitors can be used in circuit 50, with any combination of hard-wired and/or metal-mask programmable capacitors being used. Ferroelectric capacitors are chosen for the boost capacitor circuit because of their high dielectric constant and correspondingly low circuit area in integrated form.

Circuit 50 may be configured with either the boost control signal or the boost control signal and isolation signal as previously described. In summary, a boost control circuit has been shown and described having a logic circuit such as an AND gate having a first input coupled to the word line, a second input for receiving a boost control signal, and an output; and a capacitor circuit including a ferroelectric capacitor having a first electrode coupled to the output of the logic gate and a second electrode coupled to the word line. In a first embodiment, the logic circuit further includes a first power terminal coupled to VDD and a second power terminal coupled to ground. In a second embodiment, the logic circuit further includes a first power terminal coupled to VDD and a second power terminal; and a transistor having a current path coupled between the second power terminal and ground, and a gate for receiving an isolation control signal.

Referring now to FIG. 6, boost circuit 30 including NAND gate N15 and inverter N19 receives two active high input signals at nodes 32 and 34 (word line and boost control) being active high. In a typical N-channel ferroelectric memory array, the word line is active high, and this is one input to NAND N15 at node 32. The second input is a timing signal (BOOSTCTL) at node 34, which is also made active high. In this way, only the selected word line is enabled to a logic one level, so when the BOOSTCTL signal transitions high the inverter's output transitions high, boosting the word line 32. The BOOSTCTL signal is shared by all similar boost circuits 30 found in a given ferroelectric memory array block (array block not shown in FIG. 6), but since all word lines except the word line selected are low, their inverter output will remain low.

The ferroelectric capacitor Z0 is sized based on the capacitance of the word line and the desired boosting efficiency. For 50% boosting efficiency, the word line capacitance CWL=CBOOST, since VBOOST=VDD (CBOOST/(CBOOST+CWL)). The input to boosting circuit 30 is always VDD since using the CMOS technology with rail-level inputs inherently ensures the inverter output always transitions fully from rail to rail.

For a more detailed discussion of capacitor sizing in boost circuits, please refer to U.S. Pat. No. 5,774,392, entitled "Bootstrapping Circuit Utilizing a Ferroelectric Capacitor", which is hereby incorporated by reference.

Figure 7:
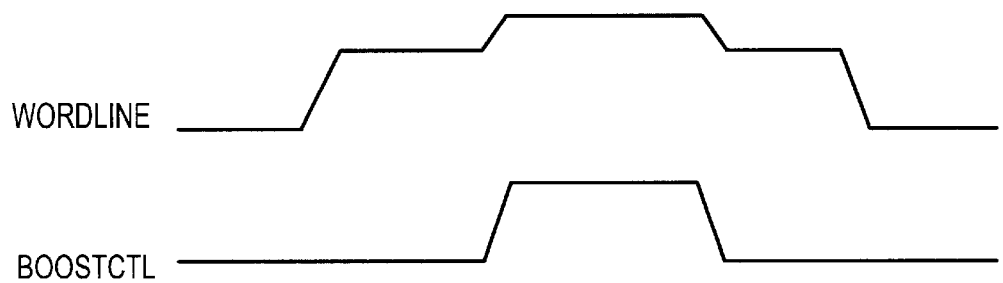
FIG. 7 is a timing diagram corresponding to the operation of the circuit of FIG. 6 showing the word line and boost control signals.

The timing diagram for boost circuit 30 is shown in FIG. 7, wherein the boosted portion of the word line waveform corresponds to the active high portion of the boost control signal.

Figure 9:
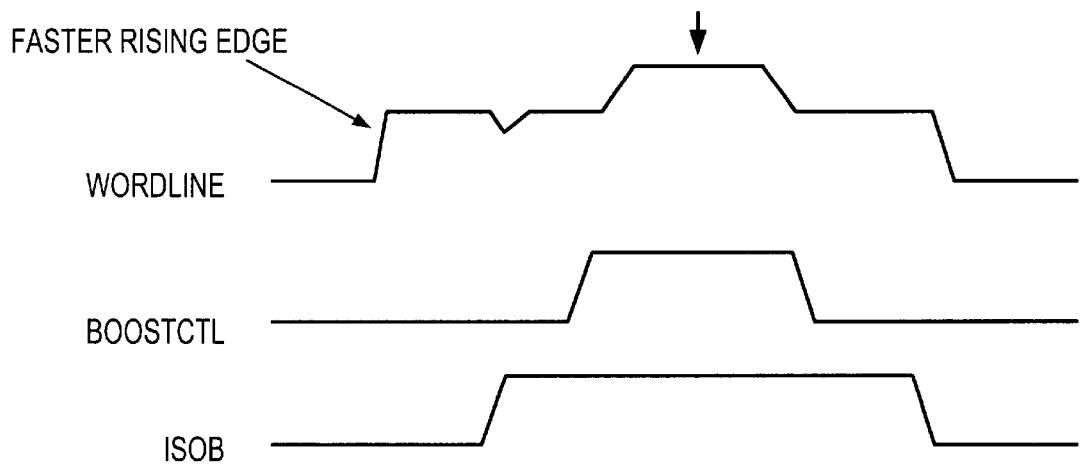
FIG. 9 is a timing diagram corresponding to the operation of the circuit of FIG. 8 showing the word line, boost control, and isolation signals.

Referring now to FIG. 8, circuit 40 adds one N-channel transistor M12 to allow for the ferroelectric capacitor's second electrode (the electrode opposite to the electrode tied to the word line 32) to be tri-stated or non-driven (floated) during the first rising edge of the word line 32. This may be advantageous in a high-speed parallel product where the access time critical path involves driving the word line high. With the second electrode floating, the capacitive load "seen" by word line driver (word line driver not shown in FIG. 8) is significantly less than in previously described circuit 30, which, for a 50% boosting efficiency, must drive the 2*CWL load from the beginning of the boost cycle. Referring now to the timing diagram of FIG. 9, when using circuit 40 the ISOB (isolation) signal can be brought high after the word line is accessed, which brings the ferroelectric capacitors second electrode low. This results in a temporary "dip" in the word line waveform, which is restored to the normal high level via the word line driver. Note also that the rise time for the word line is much faster due to the effective load being reduced to the capacitance of Z1 in series with the small parasitic capacitance of the BE node. Bringing the ferroelectric capacitor's second electrode low prepares the word line for boosting, which happens when the boost control signal BOOSTCTL rises, similar to the operation of circuit 30 shown in the timing diagram of FIG. 7.

Having described and illustrated the principle of the invention in a preferred embodiment thereof, it is appreciated by those having skill in the art that the invention can be modified in arrangement and detail without departing from such principles. For example, the voltage levels, number and nature of the boosting capacitors, polarity of the transistors, and number and nature of the control signals can be changed as desired for a particular application. We therefore claim all modifications and variations coming within the spirit and scope of the following claims.

We claim:

1. A boost circuit for boosting an output node voltage comprising:
   an AND gate having a first input coupled to the output node, a second input for receiving a first control signal, and an output;
   a capacitor circuit having a first node coupled to the output of the AND gate and a second node coupled to the output node.

2. A boost circuit as in claim 1 in which the AND gate further comprises:
   a first power terminal coupled to VDD and a second power terminal; and
   a transistor having a current path coupled between the second power terminal and ground, and a gate for receiving a second control signal.

3. A boost circuit as in claim 2 in which the second control signal is an isolation control signal for electrically isolating the capacitor from the boost circuit.

4. A boost circuit as in claim 1 in which the AND gate comprises a serially coupled NAND gate and an inverter.

5. A boost circuit as in claim 4 in which the NAND gate comprises first, second, and third transistors having serially coupled current paths, the second transistor having a gate forming the first NAND gate input, the first and third transistors having coupled gates forming the second NAND gate input, and the junction of the first and second transistors forming the output of the NAND gate.

6. A boost circuit as in claim 5 in which the first transistor comprises a P-channel transistor.

7. A boost circuit as in claim 5 in which second and third transistors each comprise an N-channel transistor.

8. A boost circuit as in claim 5 in which the NAND gate further comprises a fourth transistor coupled to the junction of the first and second transistors.

9. A boost circuit as in claim 8 in which the fourth transistor comprises a P-channel pull-up transistor.

10. A boost circuit as in claim 4 in which the inverter comprises a first transistor and second transistor having serially coupled current paths.

11. A boost circuit as in claim 10 in which the first transistor comprises a P-channel transistor.

12. A boost circuit as in claim 10 in which the second transistor comprises an N-channel transistor.

13. A boost circuit as in claim 1 in which the capacitor circuit comprises a ferroelectric capacitor.

14. A boost circuit, as in claim 1 in which the capacitor circuit comprises a plurality of ferroelectric capacitors.

15. A boost circuit as in claim 14 in which at least one of the plurality of capacitors can be selectively electrically isolated from the boost circuit.

16. A boost circuit as in claim 1 in which the first control signal is a boost control signal for controlling the duration of the boosted output voltage.

17. A boost circuit as in claim 1 in which the AND gate further comprises a first power terminal coupled to VDD and a second power terminal coupled to ground.

18. A boost circuit for boosting a word line voltage in a ferroelectric memory array comprising:
    a logic circuit having a first input coupled to the word line, a second input for receiving a boost control signal, and an output;
    a ferroelectric capacitor having a first electrode coupled to the output of the logic gate and a second electrode coupled to the word line.

19. A boost circuit as in claim 18 in which the logic circuit further comprises a first power terminal coupled to VDD and a second power terminal coupled to ground.

20. A boost circuit as in claim 18 in which the logic circuit further comprises:
    a first power terminal coupled to VDD and a second power terminal; and
    a transistor having a current path coupled between the second power terminal and ground, and a gate for receiving an isolation control signal.

* * * * *